United States Patent [19]

Smith

[11] Patent Number: 5,459,348

[45] Date of Patent: Oct. 17, 1995

[54] HEAT SINK AND ELECTROMAGNETIC INTERFERENCE SHIELD ASSEMBLY

[75] Inventor: David A. Smith, Kowloon, Hong Kong

[73] Assignee: Astec International, Ltd., Hong Kong

[21] Appl. No.: 705,097

[22] Filed: May 24, 1991

[51] Int. Cl.⁶ .............................. H01L 25/04; H01L 39/02
[52] U.S. Cl. ......................... 257/659; 257/491; 257/503; 361/767
[58] Field of Search ..................... 357/80, 84; 341/403, 341/424

[56] References Cited

U.S. PATENT DOCUMENTS

| | | | |
|---|---|---|---|
| 3,912,849 | 10/1975 | Thomas | 174/16 |
| 4,589,057 | 5/1986 | Short | 361/386 |
| 4,648,008 | 3/1987 | Neyroud et al. | 361/387 |
| 4,736,266 | 4/1988 | Tanibe | 361/424 |
| 4,739,448 | 4/1988 | Rowe et al. | 361/386 |
| 4,788,627 | 11/1988 | Ehlert et al. | 361/386 |
| 4,819,042 | 4/1989 | Kaufman | 357/80 |
| 4,879,633 | 11/1989 | Kaufman | 361/386 |
| 4,901,137 | 2/1990 | Sato et al. | 357/81 |
| 4,905,123 | 2/1990 | Windle et al. | 361/387 |
| 4,965,659 | 10/1990 | Sasame et al. | 357/81 |
| 4,965,660 | 10/1990 | Ogihara et al. | 357/81 |
| 4,965,710 | 10/1990 | Pelly et al. | 363/56 |
| 5,019,941 | 5/1991 | Craft | 361/386 |
| 5,045,642 | 9/1991 | Ohta et al. | 174/266 |
| 5,050,038 | 9/1991 | Malaurie et al. | 361/386 |
| 5,077,595 | 12/1991 | Fakunaga | 357/40 |

FOREIGN PATENT DOCUMENTS 2567324  7/1984  France .................................. 361/387

*Primary Examiner*—Sara W. Crane
*Assistant Examiner*—D. Monin
*Attorney, Agent, or Firm*—Coudert Brothers

[57] ABSTRACT

The present invention provides a heat sink and electromagnetic interference shield assembly for a plurality of semiconductor elements. The semiconductor elements are connected with other circuit elements to form an electrical circuit. Each semiconductor element has a metal portion for dissipating heat generated by the semiconductor element. The metal portion also emits electrical energy as a result of the operation of the semiconductor element thereby causing unwanted electromagnetic interference. The assembly comprises an insulator attached to the meted portion of the semiconductor element and a substrate for mounting the plurality of semiconductor elements. The insulator is of a thermally conductive material to facilitate the conduction of thermal energy away from the semiconductor element. The substrate has a metal base layer, a middle insulating layer, and a plurality of metal mounting areas for mounting the plurality of semiconductor elements. The electrical energy emitted by each semiconductor element is capacitively coupled to its corresponding metal mounting area. The assembly also contains a conductive path for returning the electrical energy coupled to the metal mounting area to one of the circuit elements such that the amount of electromagnetic interference is reduced.

7 Claims, 2 Drawing Sheets

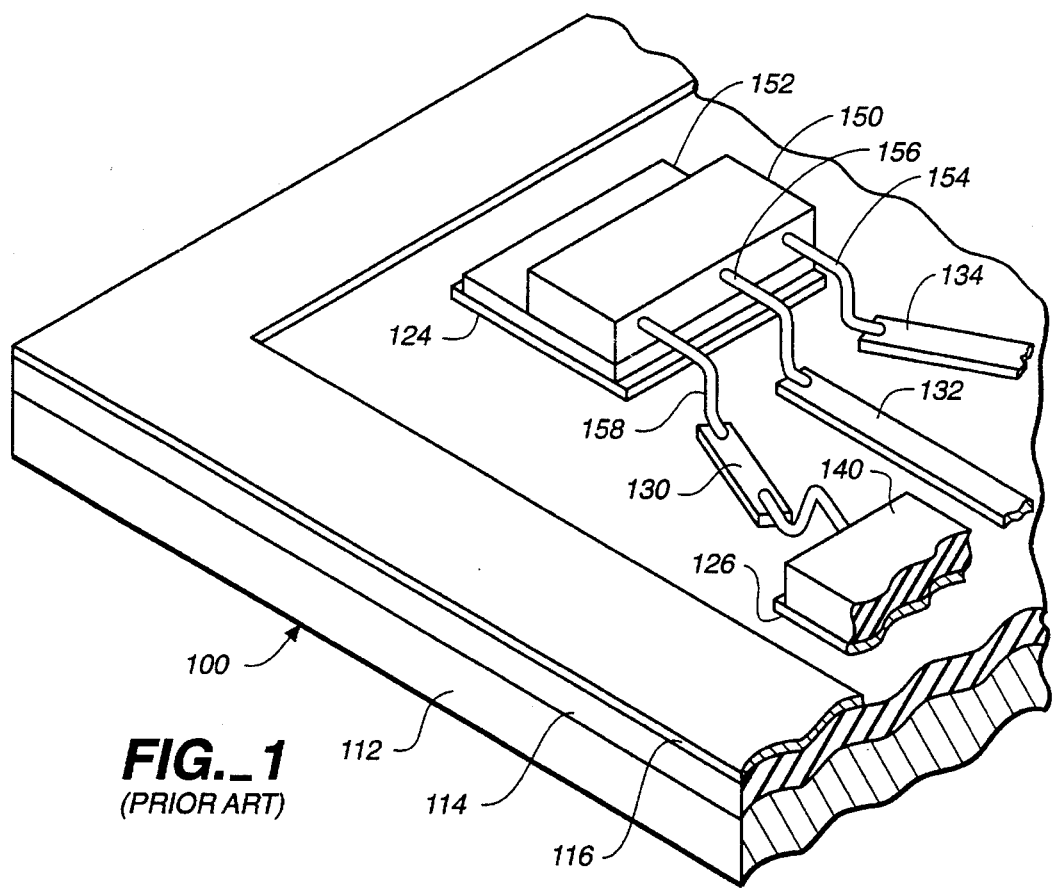
FIG._1
(PRIOR ART)
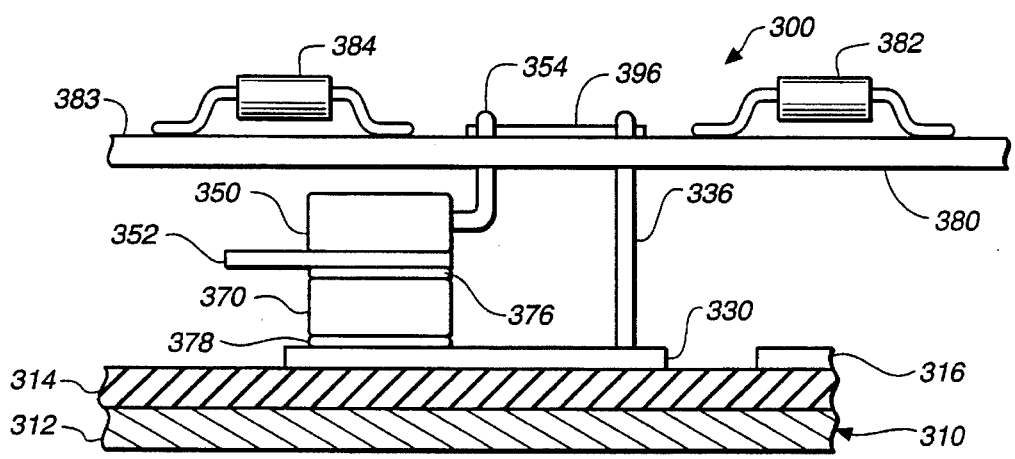
FIG._3

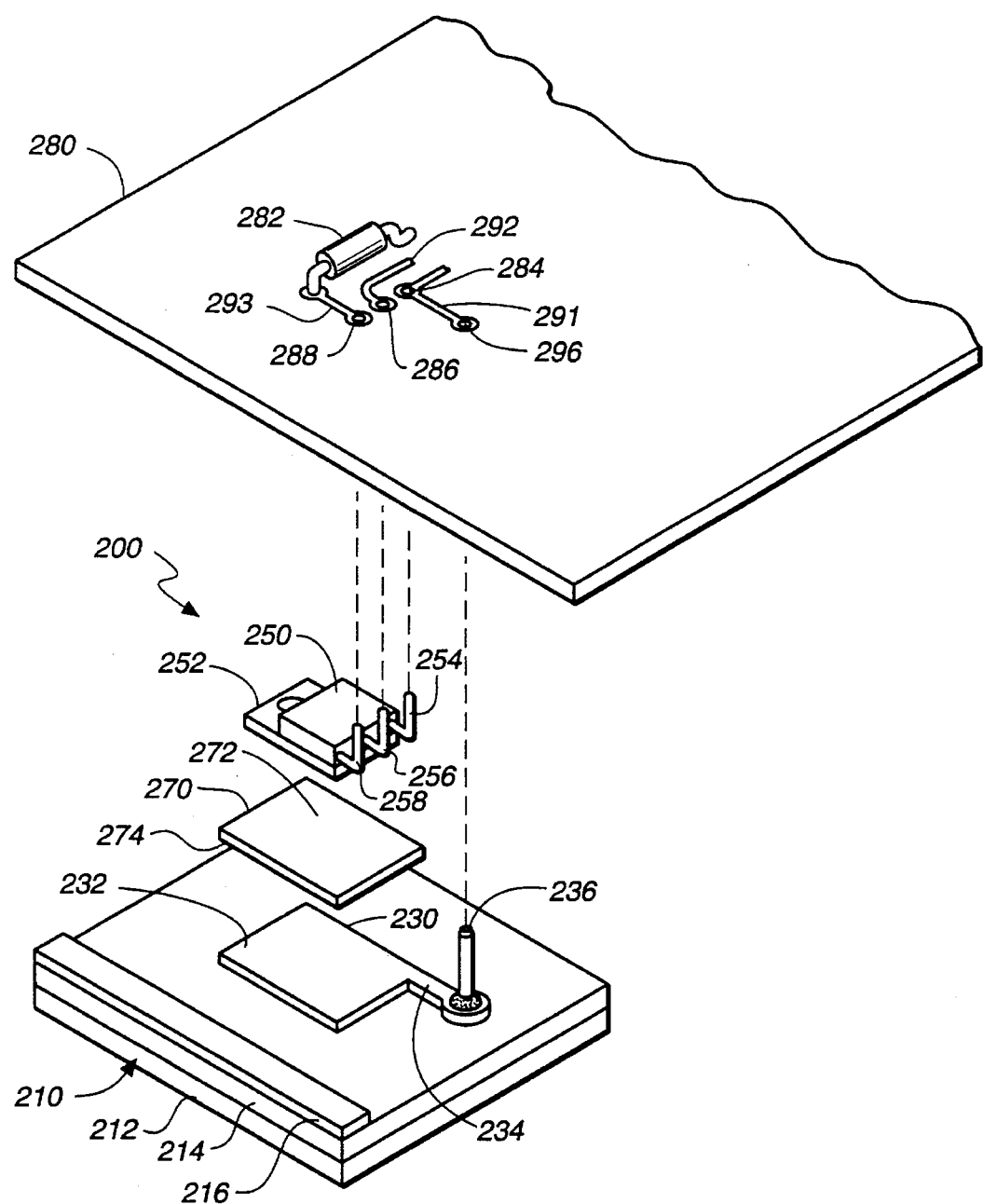
FIG._2

HEAT SINK AND ELECTROMAGNETIC INTERFERENCE SHIELD ASSEMBLY

FIELD OF THE INVENTION

This invention relates to an assembly for mounting a semiconductor element, and more particularly, to an assembly for providing a heat sink and an electromagnetic interference shield for a semiconductor element.

BACKGROUND OF THE INVENTION

One of the major problems in the design of power electronic circuits (e.g., motor drives and amplifiers) is the protection of the semiconductor elements in such circuits from overheating. A semiconductor element such as a transistor is not 100% efficient in utilizing electrical energy. As a result, some of the electrical energy in the semiconductor element is converted into thermal energy. The generation of thermal energy results in a rise in the temperature of the semiconductor element. As is well known in the art, the performance of a semiconductor element deteriorates with temperature. In addition, if the temperature of the semiconductor is above a certain value, the semiconductor element could be permanently destroyed.

One way to remove the thermal energy from a semiconductor element, thereby reducing its temperature, is by mounting the semiconductor element to a heat sink. Typically, a heat sink has a large surface area. The effect of mounting the semiconductor element to the heat sink is to increase the surface area of the element. Since the rate of heat transfer from a heat source to the ambient is proportional to the surface area of the heat source, the mounting of the semiconductor element to the heat sink allows faster heat transfer to the ambient. As a result, the temperature of the semiconductor element can be kept at a lower temperature. Examples of prior art heat sinks are described in U.S. Pat. No. 4,879,633 issued to Kaufman and U.S. Pat. No. 4,965,660 issued to Ogihara, et al.

Another major problem in the design of a power electronic circuit is the generation of electromagnetic interference (emi) by the circuit. This problem frequently arises when current is switched at a high frequency by an active device, e.g., a semiconductor transistor switching element, in the circuit. There are two major forms of emi. The first form is interference resulting from electromagnetic waves generated by the circuit and radiated to the ambient. The second form is interference resulting from electromagnetic noise that is propagated along circuit wirings.

The first form of emi arises because the wirings connecting the circuit elements in the circuit act as antennas which convert the current in the circuit into electromagnetic waves. These electromagnetic waves are radiated to the air and have potential for interfering with other electromagnetic waves carrying desirable signals, or nearby circuits sensitive to electromagnetic radiation.

The second form of emi arises because the wiring connecting the circuit elements in the circuit could act as transmission lines. Electrical energy generated at one part of the circuit can propagate through the transmission lines to a second part of the circuit even though these two parts are not connected. This electrical energy would appear as noise at the second part of the circuit. If the noise reaches the power supply of the circuit and degrades the regulation of the power supply, the operation of the whole circuit could be affected. In addition, the noise could also propagate outside the circuit to the power line through the power supply. In this case, other electronic devices sharing the same power line with the circuit would also suffer from the effects of the noise generated by the circuit.

Since the electromagnetic interference could affect a large number of electronic apparatus, the governments of many countries have set limits to the amount of electromagnetic interference which can be emitted by an electronic apparatus. If the amount of electromagnetic interference emitted by an electronic apparatus exceeds the limit, the apparatus may be prohibited from being used or sold. Consequently, the reduction of electromagnetic interference becomes an important part of the design of an electronic apparatus.

SUMMARY OF THE INVENTION

Broadly, the present invention is a heat sink and electromagnetic interference shield assembly for a semiconductor element having a metal portion for dissipating heat generated by the semiconductor element. The semiconductor element is one of a plurality of electrical elements forming an electrical circuit. The metal portion of the semiconductor element emits electrical energy generated by the operation of the semiconductor element which causes unwanted electromagnetic interference. The assembly comprises an insulator which is attached to the metal portion of the semiconductor element. The insulator comprises an electrically insulating and thermally conductive material to facilitate the conduction of thermal energy away from the semiconductor element. The assembly also comprises a metal substrate having a metal base layer, a middle layer, and a metal pattern layer wherein the middle layer comprises an electrically insulating but thermally conductive material. The metal pattern layer is patterned to provide a metal mounting area for mounting the insulator on the metal substrate. The electrical energy emitted by the metal portion of the semiconductor element is capacitively coupled to the metal mounting area. The assembly further comprises means for returning the electrical energy emitted by the metal portion of the semiconductor element and capacitively coupled to the metal mounting area to one of the plurality of circuit elements. The assembly is especially suited for use with semiconductor elements such as power switching devices, amplifiers, etc., and other devices having large voltage or current signal swings.

It is therefore an object of the present invention to provide an improved assembly for mounting a semiconductor element.

It is another object of the present invention to provide an assembly which reduces the electromagnetic interference generated by a semiconductor element while at the same time provides for the effective dissipation to the ambient of heat generated by the semiconductor element.

These and other objects of the present invention will become apparent to those skilled in the art from the following detailed description of the invention and from the accompanying drawings.

DESCRIPTION OF THE FIGURES

FIG. 1 is a perspective view of a metal prior art laminated substrate used as a heat sink for a semiconductor element mounted thereon.

FIG. 2 is an exploded view of a heat sink and electromagnetic interference shield assembly according to the present invention.

FIG. 3 is an end view of the heat sink and electromagnetic interference shield assembly of FIG. 2 according to the present invention.

DETAILED DESCRIPTION OF THE INVENTION

Devices and methods for mounting semiconductor elements to a heat sink are well known in the art. A heat sink typically comprises a metal structure having a plurality of fins. The fins increase the surface area of the heat sink thereby improving heat transfer to the ambient. The metal case of the semiconductor element is mechanically tightly coupled to the heat sink to facilitate the flow of heat generated by the semiconductor device to the heat sink. Sometimes, a thin layer of electrically insulating but thermally conductive material is placed between the metal case of the semiconductor element and the heat sink. This arrangement provides electrical insulation for the case, which is typically electrically active, without affecting the heat transfer from the semiconductor element to the ambient.

One of the problems of the arrangement described above is that the heat sink takes up valuable space. In many modern electronic devices, it is desirable to pack as many circuit elements as possible within the limited space of a circuit board. Since the fins of the heat sink take up physical space, other circuit elements cannot be placed close to the semiconductor elements. As a result, the number of circuit elements which can be arranged on the circuit board is reduced.

One way to solve the problem mentioned above is to mount all the heat generating elements in the circuit, including the semiconductor elements, on a metal plate for dissipating heat energy generated by the elements. An example of such a metal plate is a laminated metal substrate, shown in FIG. 1. The laminated metal substrate is commercially available. Metal substrate 100 in FIG. 1 comprises three layers, a metal pattern layer 116, an electrically insulating middle layer 114, and a metal base layer 112. Metal pattern layer 116 is preferably made from copper or aluminum, but other types of metal may be used. It is used to provide mechanical support for the other layers and is also used as a heat sink for dissipating thermal energy to the ambient. Since the surface area of metal base layer 112 is large, it is an effective means for dissipating thermal energy.

Middle layer 114 is preferably made from a material which is electrically insulating but thermally conductive. Thus, middle layer 114 provides electrical insulation between circuit layer 116 and metal base layer 112 while allowing thermal energy generated by the circuit elements mounted on circuit layer 116 to be conducted to metal base layer 112.

Metal pattern layer 116 is etched to form a plurality of mounting areas, such as areas 124 and 126, for mounting the heat generating elements, such as elements 140 and 150, onto metal substrate 100. In one prior art mounting method, metal substrate 100 is only used as a heat sink. There is no electrical connections on metal pattern layer 116 among the heat generating elements. Consequently, the heat generating elements and other circuit elements of the circuit are mounted on a separate printed circuit board for providing electrical connections. If the surface area of metal substrate 100 is large enough, no additional heat sink is required. Thus, the circuit elements can be packed tightly together.

Alternatively, metal substrate 100 can also be used as a circuit board in addition to being used as a heat sink. In this case, circuit layer 116 is etched to form a plurality of conductive patterns 130, 132, and 134 for providing electrical connections among the circuit elements which are surface mounted onto metal pattern layer 116. In this prior art method, metal substrate 100 serves both as a heat sink and a printed circuit board.

An example of a semiconductor element which typically requires a heat sink is a power transistor 150, shown in FIG. 1. Power transistor 150 includes a metal heat sink plate 152 and three terminals 154, 156, and 158. These terminals would be the emitter, collector, and base terminals, respectively, if power transistor 150 is a bipolar junction transistor. If power transistor 150 is a field effect transistor (FET), these terminals would be the source, drain and gate terminals, respectively. Typically, heat sink plate 152 is internally coupled to one of the three terminals 154, 156, and 158.

In one prior art mounting method, the metal heat sink plate 152 of the power transistor 150 is mounted directly onto metal pattern layer 116 of metal substrate 100 as shown in FIG. 1. This mounting method facilitates heat transfer from the power transistor to the ambient. A consequence of this mounting method, however, is that the metal heat sink plate 152, together with the middle layer 114 and the metal pattern layer 112 of the metal substrate 100, form a parallel plate capacitor. As is explained below, the formation of such a capacitor renders the prior art mounting method unsuitable for use in certain cases, e.g., in high power or high frequency switching applications.

As was described above, typically, the heat sink plate of a power transistor is internally coupled to a terminal of the power transistor. As the power transistor switches from an on-state to an off-state, and vise-versa, a large amount of transient electrical energy is switched by the terminal. This transient electrical energy is then capacitively coupled from metal pattern layer 116 on which power transistor 150 is mounted to metal base layer 112 of metal substrate 100.

There are two problems associated with the transient electrical energy coupled to the metal base layer 112. The first problem is that the transient electrical energy at the metal pattern layer 116 can be capacitively coupled to other circuit elements mounted on the metal substrate 100. This transient electrical energy would appear as noise to the other circuit elements. As a result, the operations of the other circuit elements are affected resulting in the possibility of degraded performance. The second problem is that the assembly's power supply would be contaminated if the metal base plate 112 is coupled to ground. In this case, the transient electrical energy could affect every part of the circuit and also could travel outside of the circuit into the power line. When the transient energy travels into the power line, it could be a major source of electromagnetic interference.

The mounting assembly according to the present invention is able to reduce the amount of transient electrical energy coupled to the metal base plate. As a result, only an insignificant amount of transient electrical energy is able to couple to other parts of the circuit or to the power line.

FIG. 2 is an exploded view of a preferred embodiment of a mounting assembly 200 according to the present invention. Assembly 200 comprises a power transistor 250, an insulator 270, and a metal substrate 210. Power transistor 250 is placed on top of insulator 270 which in turn is placed on top of metal substrate 210. Power transistor 250 may also be mounted on a circuit element interconnect layer, preferably a printed circuit board 280, for electrical connection to other circuit elements mounted on the circuit element interconnect layer. The areas of metal substrate 210 and printed circuit board 280 are typically large enough for mounting a plurality of circuit elements. Thus, the portion of metal substrate 210 and printed circuit board 280 shown in FIG. 2 is only a portion that is used for mounting power transistor 250.

Metal substrate 210 comprises a metal base layer 212, a middle layer 214, and a metal pattern layer 216. The arrangement and composition of these layers are similar to the corresponding metal base layer 112, middle layer 114, and metal pattern layer 116 in metal substrate 100, shown in FIG. 1.

An exemplary power transistor 250 is a FET comprising a heat sink plate 252, a source terminal 254, a drain terminal 256, and a gate terminal 258. Typically, power transistor 250 functions as a switch, i.e., during the on-state a large amount of current flows through source terminal 254 and drain terminal 256 while current ceases to flow during the off-state. It may be understood that a bipolar junction transistor may also be used as such a switch.

A metal mounting area 230 is etched into circuit layer 216 of metal substrate 210. This metal mounting area preferably has a body 232 of approximately the same surface area and shape as insulator 270 and a strip 234 for connecting body 232 to a metal connector 236. Metal connector 236 is coupled to an appropriate place on printed circuit board 280 for returning energy collected by metal mounting area 230 to the printed circuit board, as is explained below.

Insulator 270 preferably comprises a thin ceramic material although other electrically insulating materials which are thermally conductive may also be used. The surfaces 272 and 274 of insulator 270 is preferably bonded with copper foil. Metal heat sink plate 252, insulator 270, and metal mounting area 230 are then soldered together using this foil to facilitate soldering. The resulting assembly has a low thermal resistance resulting in rapid transferring of thermal energy from power transistor 250 to metal base layer 212. Alternatively, a thin layer of thermally conductive glue may be used to bond the heat sink plate 252, insulator 270, and metal mounting area 230 together.

In the assembly shown in FIG. 2, metal substrate 210 is preferably not used as a printed circuit board. Consequently, source terminal 254, drain terminal 256, and gate terminal 258 are bent in a direction away from metal substrate 210 so that these terminals can be connected to other circuit elements, shown generally as 282, on printed circuit board 280 through holes 284, 286, and 288, respectively, and conductive strips 291–293, respectively. In addition, metal connector 236 is also oriented in the same direction as terminals 254, 256, and 258 for mounting on printed circuit board 280 through a hole 296. Metal connector 236 is preferably electrically connected to source terminal 254, e.g., through conductive strip 291, for returning electrical energy capacitively collected by metal mounting area 230 to the electrical circuit.

The assembly shown in FIG. 2 reduces the amount of transient electrical energy coupled to metal base layer 212 in two different ways. First, the addition of insulator 270 reduces the capacitive coupling between power transistor 250 and metal base layer 212 because of the increased separation between these two elements and because the ceramic insulator is a good dielectric. As a result, the amount of transient electrical energy coupled to metal base layer 212 is reduced. Second, metal mounting area 230 functions as a guard screen for shielding power transistor 250 from metal base layer 212. The transient electrical energy generated by power transistor 250 is collected by metal mounting area 230. Since metal mounting area 230 is coupled to the circuit on printed circuit board 280 through metal connector 236, electrical energy is returned to the circuit. As a result, only a small amount of transient electrical energy is coupled to metal base layer 212.

FIG. 3 shows an end view of an assembly 300 according to the present invention. Assembly 300 comprises a metal substrate 310 having a metal base layer 312, a middle layer 314, and a metal pattern layer 316. A metal mounting area 330 is etched into metal pattern layer 316 of metal substrate 310. A metal connector 336 is attached to metal mounting area 330 and passes through a hole to a side 383 of printed circuit board 380. Metal connector 336 is electrically connected to a terminal 354 of a transistor 350 through conductive strip 396. Other circuit elements, for example, 382 and 384, are also mounted on printed circuit board 380.

Transistor 350 is located on the same side of printed circuit board 380 as metal mounting area 330. The metal heat sink plate 352 of transistor 350 is soldered to a layer of copper foil 376 on an insulator 370. Another layer of copper foil 378 on insulator 370 is soldered to metal mounting area 330.

It may be seen, therefore, that the heat sink assembly of the present invention allows rapid heat dissipation from a power transistor to the ambient while at the same time greatly reduces the amount of electromagnetic interference from the power transistor. The same assembly can also be used for mounting other power semiconductor elements such as diodes.

Various modifications of the invention, in addition to those shown and described herein, will become apparent to those skilled in the art from the foregoing description and accompanying drawings. Such modifications are intended to fall within the scope of the appended claims.

What is claimed is:

1. In a circuit including a plurality of semiconductor elements including a selected semiconductor element having a metal portion for dissipating heat generated by said semiconductor element, said plurality of semiconductor elements being one of a plurality of circuit elements forming a combined electrical circuit, and wherein the metal portion of said selected semiconductor element emits electrical energy as a result of the operation of said selected semiconductor element, thereby causing unwanted electromagnetic interference which interferes with the operation of the one or more other semiconductor elements in said circuit, means for minimizing the generation of said unwanted electromagnetic interference comprising:

an insulator attached to the metal portion of said selected semiconductor element, said insulator comprising an electrically insulating and thermally conductive material to facilitate the conduction of thermal energy away from said selected semiconductor element;

a substrate for mounting the plurality of semiconductor elements, said substrate having a metal base layer, a middle layer, and a metal pattern layer, said middle layer comprising an electrically insulating and thermally conductive material, said metal pattern layer being patterned into a plurality of metal mounting areas for mounting the plurality of semiconductor elements, said metal mounting areas and at least some of said circuit elements being electrically insulated from said metal base layer, said insulator being disposed on a selected one of said plurality of metal mounting areas, the electrical energy emitted by the metal portion of said selected semiconductor element being capacitively coupled to said selected metal mounting area; and means for returning said emitted electrical energy from said selected metal mounting area to one or more of said plurality of circuit elements chosen from among those of said circuit elements which are electrically insulated from said metal base layer. (such that the amount of said electromagnetic interference is reduced.)

2. The means for minimizing of claim 1 wherein said insulator comprises a layer of ceramic material.

3. The means for minimizing of claim 1 wherein said electrical energy returning means comprises a metal connector attached to said metal mounting area for electrically connecting said metal mounting area to said one of said plurality of circuit elements.

4. The means for minimizing of claim 1 wherein said selected semiconductor element comprises a field effect transistor.

5. The means for minimizing of claim 4 wherein said field effect transistor comprises a gate terminal, a source terminal, and a drain terminal and wherein said electrical energy returning means comprises a metal connector attached to said selected metal mounting area for electrically connected said selected metal mounting area to said source terminal of said field effect transistor.

6. The means for minimizing of claim 1 wherein said selected semiconductor element comprises a bipolar junction transistor.

7. In a circuit including a plurality of semiconductor elements including a selected semiconductor element having a metal portion for dissipating heat generated by said semiconductor element, said plurality of semiconductor elements being one of a plurality of circuit elements forming a combined electrical circuit, and wherein the metal portion of said selected semiconductor element emits electrical energy as a result of the operation of said selected semiconductor element, thereby causing unwanted electromagnetic interference which interferes with the operation of the one or more other semiconductor elements in said circuit, means for minimizing the generation of said unwanted electromagnetic interference comprising:

an insulator having a first face and a second face, said first face being attached to the metal portion of said selected semiconductor element, said insulator comprising an electrically insulating and thermally conductive material to facilitate the conduction of thermal energy away from said selected semiconductor element;

a substrate for mounting the plurality of semiconductor elements, said substrate having a metal base layer, a middle layer, and a metal pattern layer, said middle layer comprising an electrically insulating and thermally conductive material, said metal pattern layer being patterned into a plurality of metal mounting areas for mounting the plurality of semiconductor elements, said metal mounting areas and at least some of said circuit elements being electrically insulated from said metal base layer, said second face of said insulator being disposed on a selected one of said plurality of metal mounting areas, the electrical energy emitted by the metal portion of said selected semiconductor element being capacitively coupled to said selected metal mounting area;

a circuit element interconnect layer for mounting said plurality of said circuit elements, said circuit element interconnect layer being separated from said substrate by said insulator and said plurality of semiconductor elements; and a metal conductor attached to said selected metal mounting area for electrically coupling said selected metal mounting area and a predetermined one of said plurality of circuit elements, said metal conductor returning said emitted electrical energy from said selected metal mounting area to said predetermined circuit element such that the amount of said electromagnetic interference is reduced.

* * * * *